(12) United States Patent
Mochizuki et al.

(10) Patent No.: US 9,332,630 B2
(45) Date of Patent: May 3, 2016

(54) INSULATION CIRCUIT AND COMMUNICATION EQUIPMENT

(71) Applicant: YOKOGAWA ELECTRIC CORPORATION, Musashino-shi, Tokyo (JP)

(72) Inventors: Satoshi Mochizuki, Musashino (JP); Makoto Takeuchi, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 105 days.

(21) Appl. No.: 14/374,596

(22) PCT Filed: Oct. 9, 2012

(86) PCT No.: PCT/JP2012/076084
§ 371 (c)(1),
(2) Date: Jul. 25, 2014

(87) PCT Pub. No.: WO2013/114678
PCT Pub. Date: Aug. 8, 2013

(65) Prior Publication Data
US 2014/0368291 A1     Dec. 18, 2014

(30) Foreign Application Priority Data
Feb. 2, 2012   (JP) .................. 2012-021201

(51) Int. Cl.
*H05K 1/02* (2006.01)
*H01P 5/00* (2006.01)
*H05K 1/11* (2006.01)
*H01P 1/20* (2006.01)
*H01P 1/203* (2006.01)

(52) U.S. Cl.
CPC *H05K 1/025* (2013.01); *H01P 1/20* (2013.01); *H01P 1/203* (2013.01); *H01P 5/00* (2013.01); *H05K 1/0253* (2013.01); *H05K 1/115* (2013.01); *H05K 1/0225* (2013.01); *H05K 1/0227* (2013.01); *H05K 2201/09727* (2013.01)

(58) Field of Classification Search
CPC ..... H05K 1/025; H05K 1/0253; H05K 1/115; H01P 1/20; H01P 1/203; H01P 5/00
See application file for complete search history.

(56) References Cited

U.S. PATENT DOCUMENTS

2011/0247869 A1   10/2011   Koyama
2012/0235764 A1*   9/2012   Kang ...................... H01P 3/006
                                                                  333/26

FOREIGN PATENT DOCUMENTS

CN       102293068 A    12/2011
JP       2010-147728 A   7/2010

OTHER PUBLICATIONS

International Search Report for PCT/JP2012/076084 dated Dec. 18, 2012.

*Primary Examiner* — Stephen E Jones
*Assistant Examiner* — Scott S Outten
(74) *Attorney, Agent, or Firm* — Sughrue Mion, PLLC

(57) ABSTRACT

Disclosed is an insulation circuit comprising: a first pattern formed on a first layer of a substrate, that receives high-frequency signals; a second pattern formed on this first layer next to the first pattern and that outputs the high-frequency signals received by the first pattern; a third pattern formed on a second layer different from the first layer of the substrate and connected with a signal ground, in such a way that the first and second patterns respectively overlap in plan view; and a fourth pattern formed on the second layer next to the third pattern and connected with a frame ground, in such a way that the first and second patterns respectively overlap in plan view.

18 Claims, 6 Drawing Sheets

INSULATION CIRCUIT AND COMMUNICATION EQUIPMENT

TECHNICAL FIELD

The present invention relates to an insulation circuit and a communication equipment.

Priority is claimed on Japanese Patent Application No. 2012-021201, filed Feb. 2, 2012, the content of which is incorporated herein by reference.

BACKGROUND ART

Conventionally, in order to implement high-level automated operation in a plant or factory or the like, a distributed control system (DCS) has been constituted. Most of field devices (measuring instrument such as a pressure transmitter and actuator) that constitute the distributed control system perform communication via a wired communication bus cable. But, in recent years, wireless field devices are also realized that perform wireless communication.

Because wireless field devices may be installed in hazardous locations, such as a location in which a flammable gas is used, they must satisfy a safety standard for intrinsic safety and explosion-proofness. Specifically, they are designed so that internal electrical circuits (electronic circuits) do not act as a source of ignition for flammable gases, not only under normal conditions, but also in the event of foreseeable accidents. In addition, in order to satisfy a pressure resistance and explosion-proofness standard, it is necessary to adopt a pressure-resistant, explosion-proof construction that, even if an explosion occurs within a device, prevents flames due to the explosion from igniting a flammable gas outside of the device.

Following Patent Document 1 discloses a low-cost antenna apparatus that can be mounted in a fully enclosed container having a pressure-resistant, explosion-proof construction that is used in a hazardous location. With this antenna apparatus, in order to satisfy an intrinsic safety and explosion-proofness standard, two blocking capacitors are connected in series via a printed pattern and mounted on one surface of a printed circuit board housed in a housing, and two blocking capacitors are connected in series via a printed pattern and mounted on the other surface of the printed circuit board.

PRIOR ART DOCUMENTS

Patent Documents

[Patent Document 1] Japanese Unexamined Patent Application, First Publication No. 2010-147728

DISCLOSURE OF INVENTION

Problems to be Solved by the Invention

In an on-site location such as a plant in which the above-described wireless field device is installed, many devices that generate electromagnetic noise, such as motors, are installed. For this reason, noise countermeasures are extremely important in wireless field devices. In particular, in cases in which a remote antenna installed at a position distant from the wireless field device is used, because there is a large possibility of noise being superimposed on a signal transmitted via a connecting cable that connects the remote antenna and the wireless field device, the influence of external noise can be expected to be great.

If the signal ground and the frame ground are in common within a wireless field device, electronic circuits provided in the wireless field device might be destroyed by external noise intruding into the wireless field device. For this reason, in a wireless field device, in order to prevent destruction of electronic circuits while satisfying the above-noted intrinsic safety and explosion-proofness standard, the need arises to separate the signal ground and the frame ground within the wireless field device, and to provide DC insulation therebetween.

The main methods of DC-insulating the above-noted signal ground and frame ground are the method of using a chip capacitor and the method of using an RF balun. That is, by providing a chip capacitor or an RF balun between the signal ground and the frame ground or between the signal lines, the signal ground and the frame ground are DC-insulated.

However, because in the above-noted methods DC insulation is achieved by discrete elements such as a chip capacitor or balun, there is a constraint that insulation is required on the outer surface of the board. Under this constraint, the following various problems arise. For example: the level of mounting integration (surface area occupied for mounting) becoming large, making it difficult to achieve high-density mounting; the thickness of the board becoming large, and the wiring patterns becoming thick, making loss due to copper losses become large; a lack of freedom of selection of components to be used (discrete elements); a lack of appropriate components simultaneously achieving both the required insulation breakdown voltage or RF characteristics and a high withstand voltage, or the cost of components becoming high.

The present invention provides an insulation circuit and a communication equipment that can improve the noise-immunity performance while satisfying an intrinsic safety and explosion-proofness standard, without using discrete elements such as chip capacitors.

Means for Solving the Problems

An insulation circuit may include: a first pattern formed on a first layer of a board and receiving an RF signal; a second pattern formed on the first layer next to the first pattern, the second pattern outputting the RF signal received by the first pattern; a third pattern formed on a second layer different from the first layer of the board so as to overlap the first and second patterns respectively when seen in a plan view manner, the third pattern connecting to a signal ground; and a fourth pattern formed on the second layer next to the third pattern so as to overlap the first and second patterns respectively when seen in a plan view manner, the fourth pattern connecting to a frame ground.

A first slit extending in the direction in which the first and second patterns extend may be formed in the third pattern, when seen in plan view manner, between the overlapping part with the first pattern and the overlapping part with the second pattern. A second slit extending in the direction in which the first and second patterns extend may be formed in the fourth pattern, when seen in plan view manner, between the overlapping part with the first pattern and the overlapping part with the second pattern.

The third pattern may have at least one first aperture part formed along at least one side of the overlapping part with the second pattern when seen in plan view manner; and the fourth pattern has at least one second aperture part formed along at least one side of the overlapping part with the first pattern when seen in plan view manner.

The insulation circuit may further include: a fifth pattern formed on the first layer so as to overlap with the third pattern when seen in plan view manner, one end of the fifth pattern being connected to the first pattern, the other end of the fifth pattern being connected to the third pattern through a first via; and a sixth pattern formed on the first layer so as to overlap with the fourth pattern when seen in plan view manner, one end of the sixth pattern being connected to the second pattern, the other end of the sixth pattern being connected to the fourth pattern through a second via.

The third and fourth patterns may be separated by at least a distance that is set forth in an intrinsic safety and explosion-proofness standard within the second layer.

The board may be a double-sided board on which patterns are formed on the first layer that is a front surface and on the second layer that is a rear surface.

The board may be a multilayer board providing at least one layer in which patterns are formed between the front surface and the rear surface.

A board having a prescribed thickness may be interposed between the first and second patterns and the third and fourth patterns.

The first and second patterns may be straight-line shapes and have a plurality of pads for impedance matching.

One end of the first and second patterns may have pre-established characteristic impedances and the other ends thereof may be open ends.

The first aperture part may be formed along both sides of the overlapping part of the second and third patterns. The second aperture part may be formed along both sides of the overlapping part of the first and fourth patterns.

The first aperture part may be formed along one side of the overlapping part of the second and third patterns.

The second aperture part may be formed along one side of the overlapping part of the first and fourth patterns.

The communication equipment may perform at least one of transmission and reception of an RF signal. The communication equipment may include an insulation circuit comprising: a first pattern formed on a first layer of a board and receiving the RF signal; a second pattern formed on the first layer next to the first pattern and outputting the RF signal received by the first pattern; a third pattern formed on a second layer different from the first layer of the board so as to overlap the first and second patterns respectively when seen in a plan view manner and connecting to a signal ground; and a fourth pattern formed on the second layer next to the third pattern so as to overlap the first and second patterns respectively when seen in a plan view manner and connecting to a frame ground. A signal line in which the RF signal may be transmitted is connected to the first and second patterns and the signal ground and the frame ground may be DC-insulated.

A first slit that is extending in the direction in which the first and second patterns are extending may be formed in the third pattern, when seen in plan view manner, between the overlapping part with the first pattern and the overlapping part with the second pattern. A second slit that is extending in the direction in which the first and second patterns are extending may be formed in the fourth pattern, when seen in plan view manner, between the overlapping part with the first pattern and the overlapping part with the second pattern.

The third pattern may have at least one first aperture part formed along at least one side of the overlapping part with the second pattern when seen in plan view manner. The fourth pattern may have at least one second aperture part formed along at least one side of the overlapping part with the first pattern when seen in plan view manner.

The insulation circuit may further include: a fifth pattern formed on the first layer so as to overlap with the third pattern when seen in plan view manner, one end of the fifth pattern being connected to the first pattern, the other end of the fifth pattern being connected to the third pattern through a first via; and a sixth pattern formed on the first layer so as to overlap with the fourth pattern when seen in plan view manner, one end of the sixth pattern being connected to the second pattern, the other end of the sixth pattern being connected to the fourth pattern through a second via.

The third and fourth patterns may be separated by at least a distance that is set forth in an intrinsic safety and explosion-proofness standard within the second layer.

Effects of the Invention

According to the present invention, a first pattern to which an RF signal is input and a second pattern that outputs the RF signal are formed in arrangement on a first layer of a board, and a third pattern connected to a signal ground and a fourth pattern connected to a frame ground are formed in an arrangement on a second layer, so as to be superposed over the first and second patterns when seen in plan view manner. By doing this, because the signal ground and the frame ground are DC-insulated, it is possible to improve the noise-immunity performance, while satisfying an intrinsic safety and explosion-proofness standard, without using discrete elements such as chip capacitors.

EMBODIMENTS FOR CARRYING OUT THE INVENTION

An insulation circuit and a communication equipment in accordance with a preferred embodiment of the present invention will be described in detail below, with references made to the drawings.

(Insulation Circuit)

Figure 1:
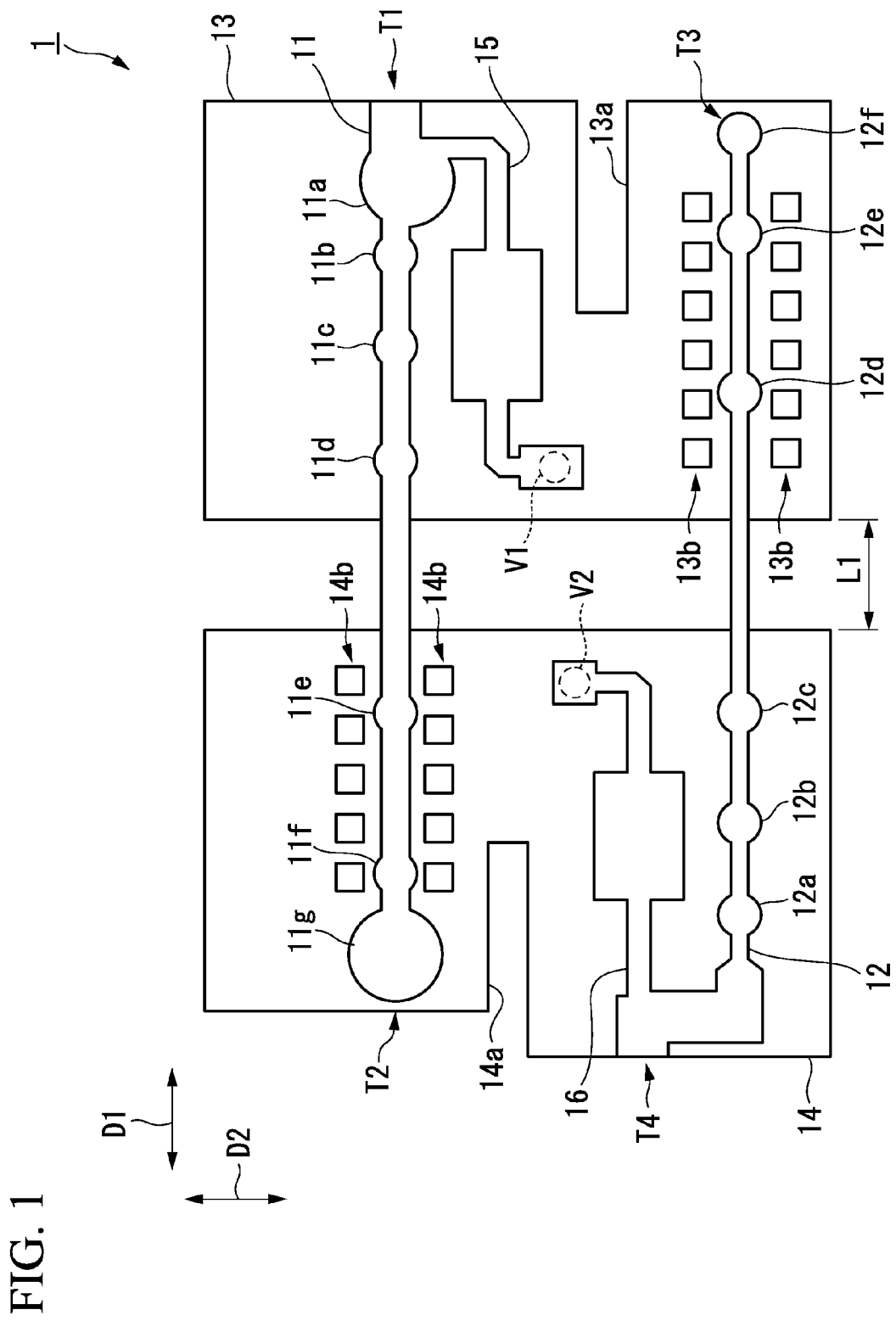
FIG. 1 is a plan view illustrating the constitution of an insulation circuit in accordance with a first preferred embodiment of the present invention.

FIG. 1 is a plan view illustrating the constitution of an insulation circuit in accordance with a first preferred embodiment of the present invention. As shown in FIG. 1, an insulation circuit 1 in accordance with a first preferred embodiment of the present invention includes four patterns 11 to 14 (first pattern 11, second pattern 12, third pattern 13, and fourth pattern 14) and two auxiliary patterns 15 and 16 (fifth pattern 15 and sixth pattern 16) formed on a board (not shown) having at least two layers. By this constitution the insulation circuit 1 transfers a desired RF signal while DC-insulating the signal ground SG and the frame ground FG (neither shown in FIG. 1; refer to FIG. 2).

In the following, to simplify the description, the board on which the patterns 11 to 14 and the auxiliary patterns 15 and 16 are formed is a double-sided board on which patterns are formed on the front surface (first layer) and the rear surface (second layer). The board on which the patterns 11 to 14 and the auxiliary patterns 15 and 16 are formed is not restricted to being a double-sided board, and may be a multilayer board providing at least one layer in which patterns are formed between the front surface and the rear surface. For example, a fiberglass epoxy board, a ceramic board, or a Teflon (registered trademark) board or the like may be used as this board.

The patterns 11 and 12 and the auxiliary patterns 15 and 16 are formed on the front surface of the board, using a metal having a small electrical resistance, such as copper (Cu) or aluminum (Al). In contrast, the patterns 13 and 14 are formed on the rear surface of the board, using a metal similar to that of the patterns 11 and 12 and the auxiliary patterns 15 and 16. In FIG. 1, although the example shown is one in which, when viewed in plan view manner, the patterns 11 and 12 and auxiliary patterns 15 and 16 overlap with the patterns 13 and 14, in reality a board having a prescribed thickness is interposed between the patterns 11 and 12 and auxiliary patterns 15 and 16 and the patterns 13 and 14. In the following, the direction in which the patterns 11 and 12 extend will be called the longitudinal direction D1, and the direction intersecting with the longitudinal direction D1 and parallel to the front surface of the board will be called the intersecting direction D2.

The pattern 11 is a straight-line pattern that extends in the longitudinal direction D1, and to which an RF signal to be transferred is input. The pattern 11 has formed thereon a plurality of pads 11a to 11g for the purpose of impedance matching (hereinafter called impedance matching pads), and an RF signal to be transferred is input to one end T1 of the pattern 11. In the example shown in FIG. 1, the impedance matching pad 11a formed to be the closest to the one end T1 of the pattern 11 and the impedance matching pad 11g formed on the other end T2 of the pattern 11 are formed to be larger than the other impedance matching pads 11b to 11f.

The pattern 11 is designed so that the one end T1 has a pre-established characteristic impedance (for example, 50Ω), and so that the other end T2 thereof is an open end. That is, the pattern 11 is designed so that an RF signal input from the one end T1 is easily radiated from the other end T2. The number and shapes of the impedance matching pads 11a to 11g formed on the pattern 11 can be arbitrarily set in accordance with the required power transfer efficiency.

The pattern 12 is a pattern that is a straight-line pattern extending in the longitudinal direction D1, arranged at a prescribed spacing in the intersecting direction D2, and formed next to the pattern 11, from which an RF signal input in the pattern 11 is output. In the same manner as the pattern 11, the pattern 12 has a plurality of impedance matching pads 12a to 12f for the purpose of impedance matching formed thereon, and the RF signal is output from one end T4 thereof. In the example shown in FIG. 1, the impedance matching pad 12a to 12f are formed to have substantially the same size.

The pattern 12, similar to the pattern 11, is designed so that the one end T4 thereof has the above-described characteristic impedance, and so that the other end T3 thereof is an open end. The number and shapes of the impedance matching pads 12a to 12f formed on the pattern 12, similar to the impedance matching pads 11a to 11g formed on the pattern 11, can be arbitrarily set in accordance with the required power transfer efficiency.

The pattern 13 is a substantially rectangular pattern that is formed so as to overlap with the patterns 11 and 12 when seen in plan view manner, and is connected to the above-described signal ground SG. The pattern 13 has formed therein a slit 13a (hereinafter call an impedance matching slit) and a plurality of aperture patterns 13b (apertures) for the purpose of adjusting the transfer characteristics within and outside the band of the RF signal to be transferred.

The impedance matching slit 13a is a rectangularly shaped slit extending in the longitudinal direction D1, formed at the right edge part of the pattern 13 in the drawing, when seen in plan view manner, between the overlapping parts of the patterns 11 and 13 and the overlapping parts of the patterns 12 and 13. The aperture patterns 13b are substantially rectangularly shaped apertures when seen in plan view manner, and a plurality thereof are formed along both sides of the overlapping part of patterns 12 and 13. The shapes and sizes of the impedance matching slit 13a and the aperture patterns 13b and the number of the aperture patterns 13b can be arbitrarily set in accordance with the required transfer characteristics. Also, the aperture patterns 13b do not necessarily need to be formed along both sides of the overlapping part of the patterns 12 and 13, and may be formed along only one side thereof.

The pattern 14 is a pattern that is a substantially rectangular shape, formed next to the pattern 13 so as to overlap with the patterns 11 and 12 when seen in plan view manner and connected to the above-described frame ground FG. In the same manner as the pattern 13, the pattern 14 has an impedance matching slit 14a and a plurality of aperture patterns 14b (apertures parts) for the purpose of adjusting the transfer characteristics within and outside the band of the RF signal to be transferred.

The impedance matching slit 14a is a rectangularly shaped slit extending in the longitudinal direction D1, formed at the left edge part of the pattern 14 in the drawing so as to overlap, when seen in plan view manner, between the overlapping parts of patterns 11 and 14, and the overlapping parts of the patterns 12 and 14. The aperture patterns 14b are substantially rectangularly shaped apertures when seen in plan view manner, and a plurality thereof are formed along both sides of the overlapping part of patterns 11 and 14. The shapes and sizes of the impedance matching slit 14a and the aperture patterns 14b and the number of aperture patterns 14b can be arbitrarily set in accordance with the required transfer characteristics. The aperture patterns 14b do not necessarily need to be formed along both sides of the overlapping parts of patterns 11 and 14, and may be formed along only one side.

In this case, because the structure of the overlapping part between patterns 11 and 12 and patterns 13 and 14 when seen in plan view manner is the same as in a microstrip line, there is a magnetic coupling between the patterns 11 and 12 that are formed on the front surface of the board and the patterns 13 and 14 that are formed on the rear surface of the board. The length of the overlapping parts of the patterns 11 and 14 in the longitudinal direction D1 is set so as to be a length so that the magnetic coupling of the patterns 11 and 14 is mutually strengthened, and the length of the overlapping parts of the patterns 12 and 13 in the longitudinal direction D1 is set so as to be length so that the magnetic coupling of the patterns 12 and 13 is mutually strengthened. The pattern 13 that is connected to the signal ground SG and the pattern 14 that is connected to the frame ground FG are separated by at least a distance L1 (for example, 0.5 mm or greater) that is set forth in an intrinsic safety and explosion-proofness standard.

The auxiliary pattern 15 is formed on the front surface of the board so as to overlap with the pattern 13 when seen in plan view manner. One end thereof is connected to the pattern 11, and the other end thereof is connected pattern 13 through a via V1. The auxiliary pattern 15 forms a short stub with respect to the pattern 11, and is provided for the purpose of adjusting the transfer characteristics outside the band of the RF signal to be transferred.

The auxiliary pattern 16 is formed on the front surface of the board so as to overlap with the pattern 14 when seen in plan view manner. One end thereof is connected to the pattern 12, and the other end thereof is connected to the pattern 14 through a via V2. The auxiliary pattern 16 forms a short stub with respect to the pattern 12, and is provided for the purpose of adjusting the transfer characteristics outside the band of the RF signal to be transferred.

Figure 2:
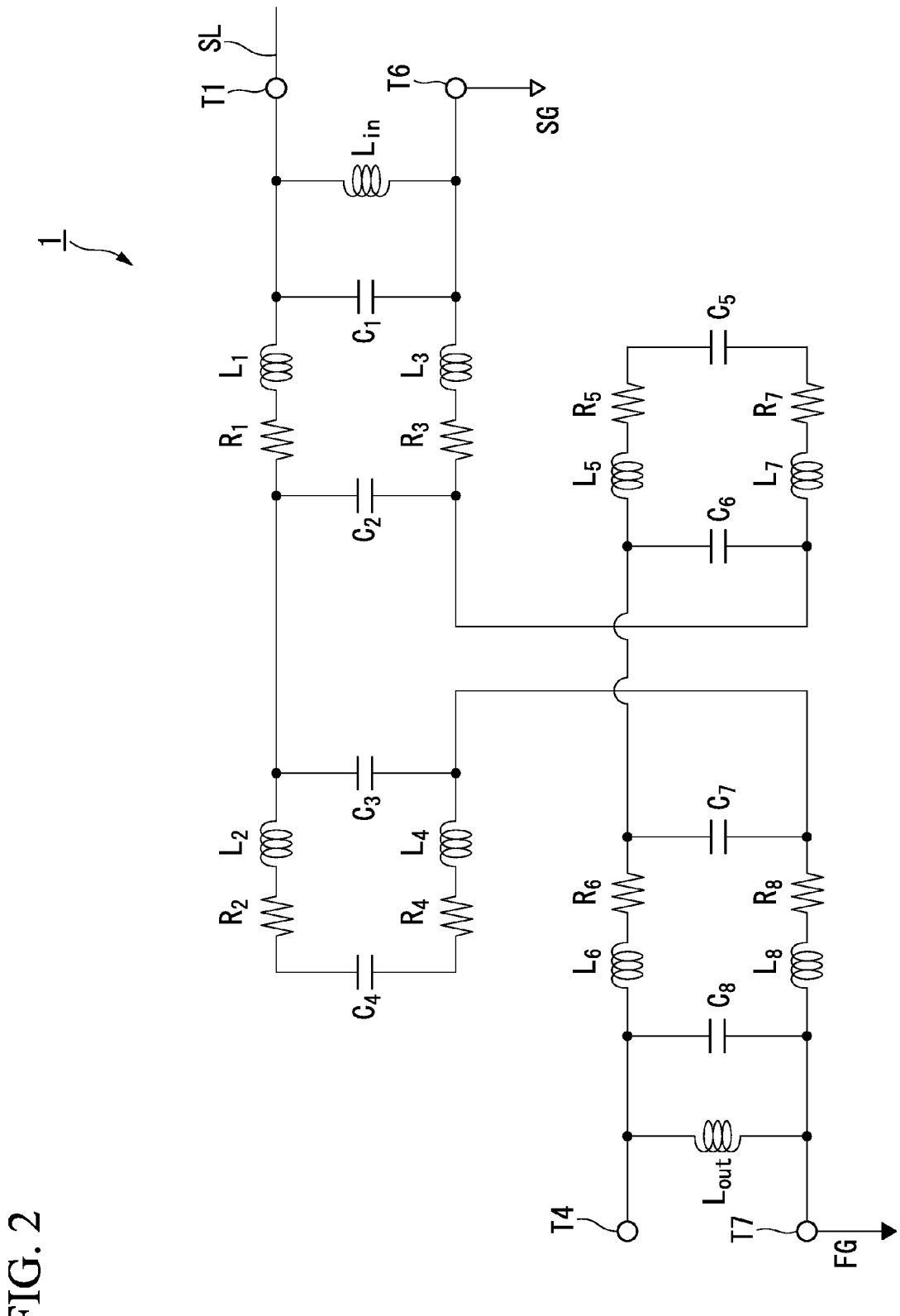
FIG. 2 is a circuit diagram illustrating an equivalent circuit of the insulation circuit shown in FIG. 1.

FIG. 2 is a circuit diagram illustrating an equivalent circuit of the insulation circuit shown in FIG. 1. As shown in FIG. 2, a signal line SL that supplies an RF signal is connected to the one end T1 of the pattern 11, and a signal ground SG is connected to one end T6 of the pattern 13 that is opposite the one end T1 of the pattern 11. The frame ground FG is connected to one end T7 of the pattern 14 that is opposite one end T4 of the pattern 12 that outputs an RF signal.

In FIG. 2, the resistive components of the pattern 11 are represented by $R_1$ and $R_2$, and the inductive components thereof are represented by $L_1$ and $L_2$. The resistive components of the pattern 12 are represented by $R_5$ and $R_6$, and the inductive components thereof are represented by $L_5$ and $L_6$. The resistive components of the pattern 13 are represented by $R_3$ and $R_4$ and the inductive components thereof are represented by $L_3$ and $L_4$. The resistive components of the pattern 14 are represented by $R_7$ and $R_8$ and the inductive components thereof are represented by $L_7$ and $L_8$.

In FIG. 2, the inductive component of the auxiliary pattern 15 is represented by $L_{in}$, and the inductive component of auxiliary pattern 16 is represented by $L_{out}$. In FIG. 2, the capacitive components between the patterns 11 and 13 are represented by $C_1$ and $C_2$, and the capacitive components between the patterns 11 and 14 are represented by $C_3$ and $C_4$. The capacitive components between the patterns 12 and 13 are represented by $C_5$ and $C_6$, and the capacitive components between the patterns 12 and 14 are represented by $C_7$ and $C_8$.

Figure 3:
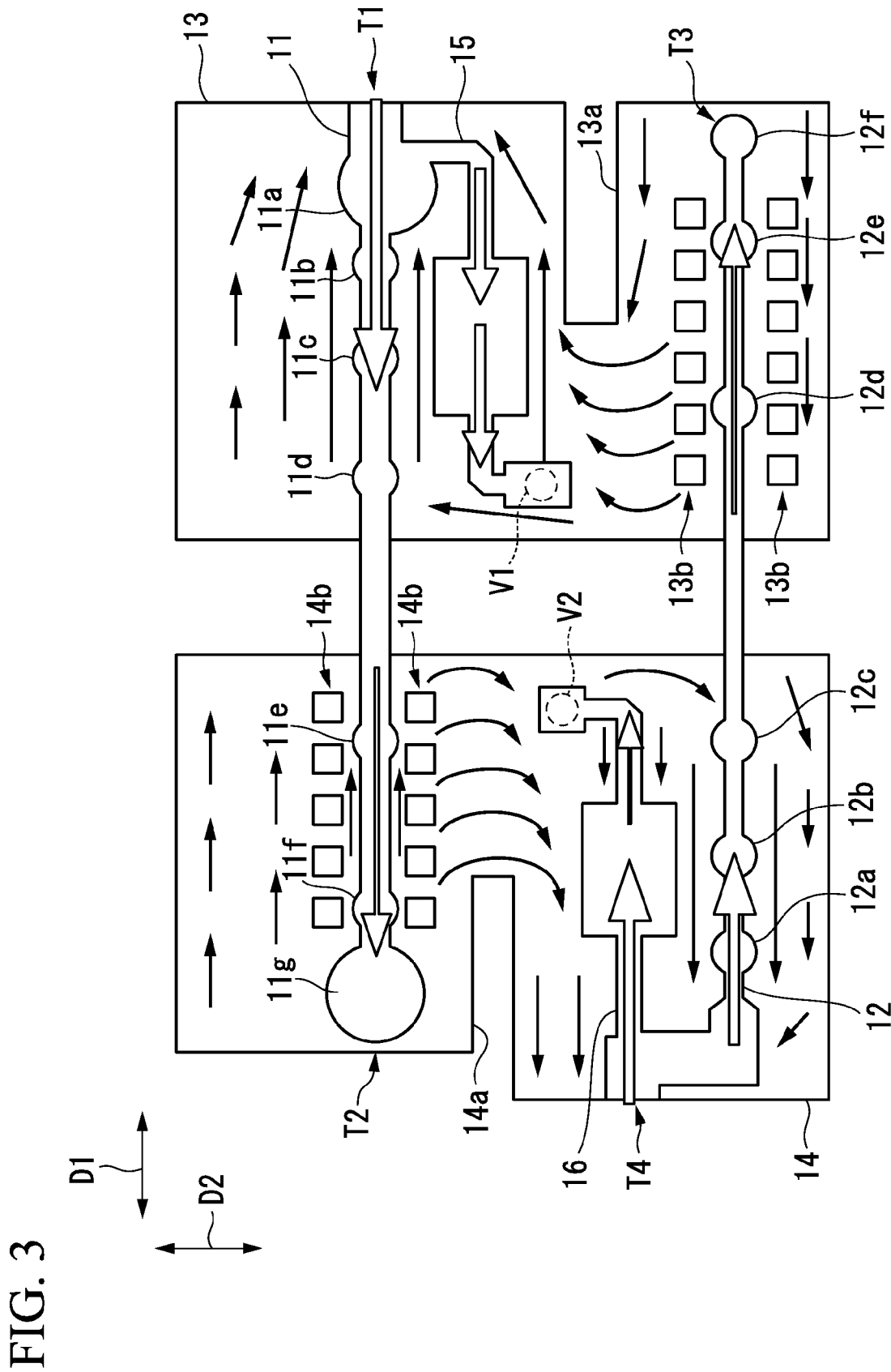
FIG. 3 is a plan view schematically illustrating the magnetic field distribution formed in the insulation circuit in accordance with a first preferred embodiment of the present invention.

Next, the operation of the insulation circuit 1 having the above-noted constitution will be described. FIG. 3 is a plan view schematically illustrating the magnetic field distribution formed in the insulation circuit in accordance with a first preferred embodiment of the present invention. In FIG. 3, the magnetic field distribution occurring in the patterns 11 and 12 and the auxiliary patterns 15 and 16 formed on the front surface of the board are shown by enlarged white arrows, and the magnetic field distribution occurring in the patterns 13 and 14 formed on the rear surface of the board are shown by normal arrows.

As shown in FIG. 3, when an RF signal is input from the signal line SL shown in FIG. 2 to the one end T1 of the pattern 11 of the insulation circuit, a leftward-directed magnetic field distribution occurs along the longitudinal direction D1 of the pattern 11, and the RF signal propagates toward the left in the pattern 11, and sequentially passes through the impedance matching pads 11a to 11g. The RF signal that is input at the one end T1 of the pattern 11 reaches the pattern 13 via the auxiliary pattern 15 and the via V1, in that sequence, propagates rightward along the longitudinal direction D1 in the pattern 13, and returns to directly below the one end T1 of the pattern 11.

Because the pattern 11 is formed so as to overlap with the patterns 13 and 14 when seen in plan view manner and is magnetically coupled to each of the patterns 13 and 14, a part of the RF signal propagating leftwardly in the pattern 11 propagates to the pattern 13, and the remainder thereof propagates to the pattern 14. The RF signal that propagates to the pattern 13 propagates rightwardly along the longitudinal direction D1 in the pattern 13, and returns to directly below the one end T1 of the pattern 11.

In contrast, the RF signal that has propagated to the pattern 14 propagates in the pattern 14 via gaps in the aperture patterns 14b so as to avoid the impedance matching slit 14a, and reaches to directly below the overlapping part of the pattern 12 and the one end T4 of the pattern 12. Because the pattern 14 is formed so as to overlap with the pattern 12 when seen in plan view manner and is magnetically coupled to the pattern 12, the RF signal that reaches the part overlapping with the pattern 12 when seen in plan view manner is propagated to the pattern 12.

The RF signal that has propagated to the pattern 12 propagates in the pattern 12 rightward along the longitudinal direction D1, and sequentially passes through the impedance matching pads 12a to 12f. Because the pattern 12 is formed so as to overlap with the pattern 13 when seen in plan view manner and is magnetically coupled to the pattern 13, the RF signal that propagates rightwardly in the pattern 12 propagates to the pattern 13. The RF signal that has propagated to the pattern 13 propagates in the pattern 13 via gaps in the aperture patterns 13b formed in the patterns 13 so as to avoid the impedance matching slit 13a, and reaches to directly below the one end T1 of the pattern 11. By the above-noted operation, the RF signal input from the one end T1 of the pattern 11 is output from the one end T4 of the pattern 12.

Figure 4A:
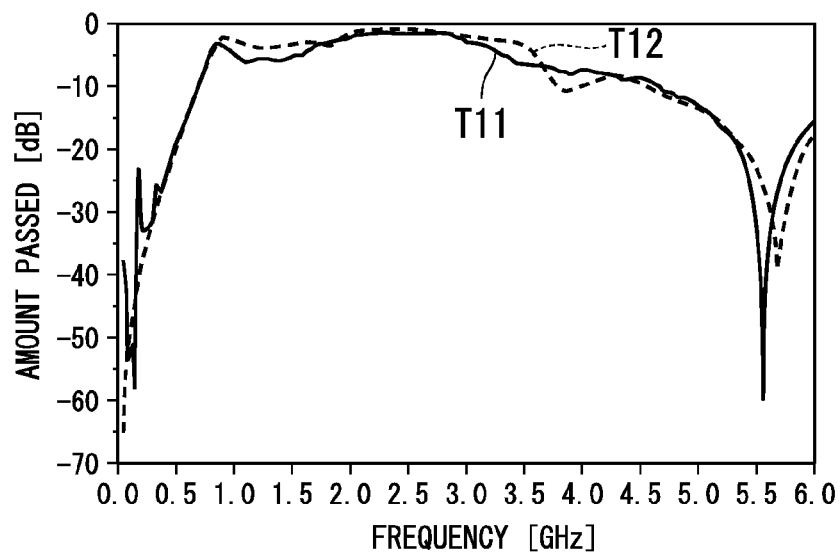
FIG. 4A is a view illustrating the reflection and pass characteristics of the insulation circuit in accordance with a first preferred embodiment of the present invention.
Figure 4B:
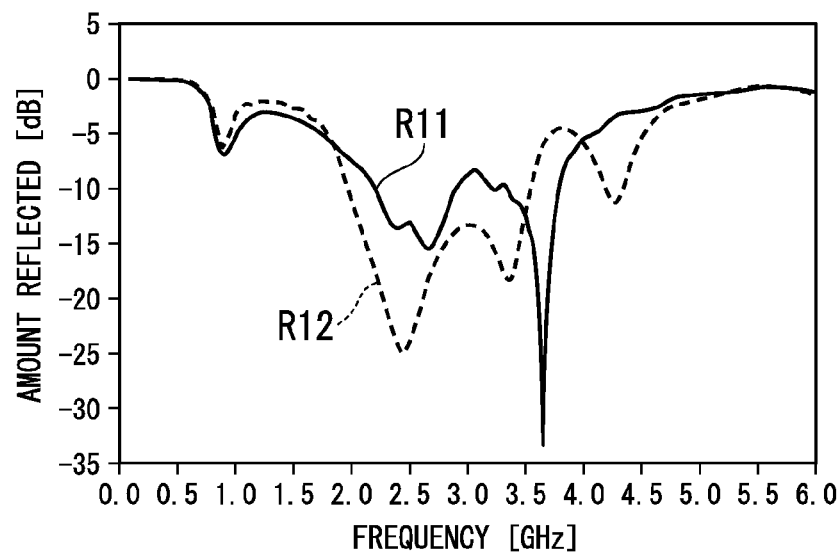
FIG. 4B is a view illustrating the reflection and pass characteristics of the insulation circuit in accordance with a first preferred embodiment of the present invention.
Figure 4C:
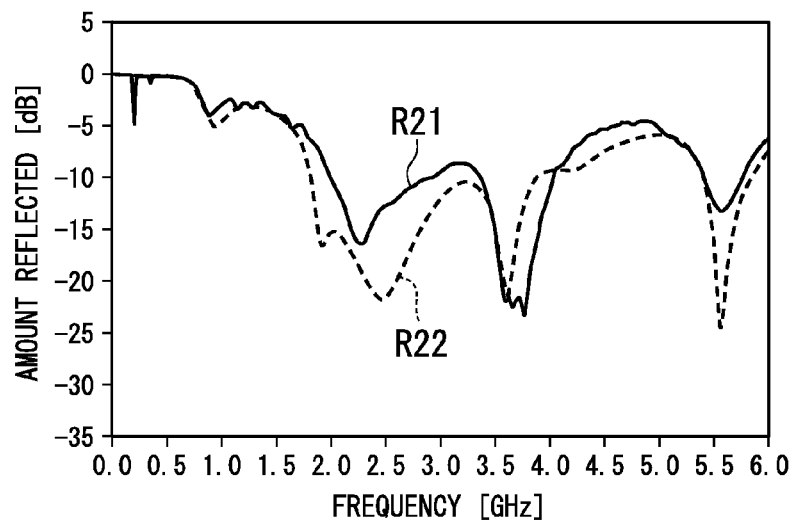
FIG. 4C is a view illustrating the reflection and pass characteristics of the insulation circuit in accordance with a first preferred embodiment of the present invention.

FIG. 4A to FIG. 4C are views illustrating the reflection and pass characteristics of the insulation circuit in accordance with a first preferred embodiment of the present invention. FIG. 4A shows the pass characteristics, FIG. 4B shows the reflection characteristics at the input side, and FIG. 4C shows the reflection characteristics at the output side. In FIG. 4A, the curve marked T11 shows the actually measured values of the pass characteristics of the insulation circuit 1, and the curve marked T12 shows the results of a simulation of the pass characteristics of the insulation circuit 1. In FIG. 4B and FIG. 4C, the curves marked R11 and R21 show the actually measured values of the reflection characteristics of the insulation circuit 1, and the curves marked R12 and R22 show the results of simulations of the reflection characteristics of the insulation circuit 1.

Stated precisely, the curves T11 and T12, the curves R11 and R12, and curves R21 and R22 shown in FIG. 4A to FIG. 4C show the following characteristics. Specifically, the curves T11 and T12 show the frequency characteristics of the scattering parameter (S parameter) S21 for the case of treating the insulation circuit 1 as a four-terminal circuit. The curves R11 and R12 show the frequency characteristics of the scattering parameter S11, and the curves R21 and R22 show the frequency characteristics of the scattering parameter S22.

Referring to FIG. 4A to FIG. 4C, it is first seen that the actually measured values of the pass characteristics and the reflection characteristics of the insulation circuit 1 substantially coincide, respectively, with the simulation results for the pass characteristics and the reflection characteristics of the insulation circuit 1. Next, referring to FIG. 4A, it can be seen that good pass characteristics are obtained across the frequency band of approximately 1 to 5 GHz. In particular, in the vicinity of 2.5 GHz it can be seen that almost all of the input RF signal passes through the insulation circuit 1 and, referring to FIG. 4B and FIG. 4C, it can be seen that the amount of reflection exhibits minimums in the vicinities of 2.5 GHz and 3.7 GHz. In this manner, from the results shown in FIG. 4A to FIG. 4C, it can be seen that even if the signal ground SG and frame ground FG are DC-insulated, the characteristics of the insulation circuit 1 are such that an RF signal having a frequency in the vicinity of 2.5 GHz is transferred with almost no reflection.

As described above, in the insulation circuit 1 shown in FIG. 1, the pattern 11 to which an RF signal is input and the pattern 12 that outputs the RF signal are formed on the front surface of a board, and the pattern 13 connected to the signal ground SG and the pattern 14 connected to the frame ground FG are formed on the rear surface of the board, so as to overlap, respectively, with the patterns 11 and 12 when seen in plan view manner. For this reason, it is possible to provide DC insulation between the signal ground SG and the frame ground FG, without using discrete elements such as chip capacitors. By doing this, it is possible to improve noise immunity performance, while satisfying an intrinsic safety and explosion-proofness standard.

In this manner, the insulation circuit 1 shown in FIG. 1 need not use discrete elements such as chip capacitors. For this reason, the following various problems do not occur, for examples: the level of mounting integration (surface area occupied for mounting) becoming large, making it difficult to achieve high-density mounting; the thickness of the board becoming large, and the wiring patterns becoming thick, making loss due to copper losses become large; a lack of freedom of selection of components to be used (discrete elements); a lack of appropriate components simultaneously achieving both the required insulation breakdown voltage, or RF characteristics and a high withstand voltage, or the cost of components becoming high.

Figure 5:
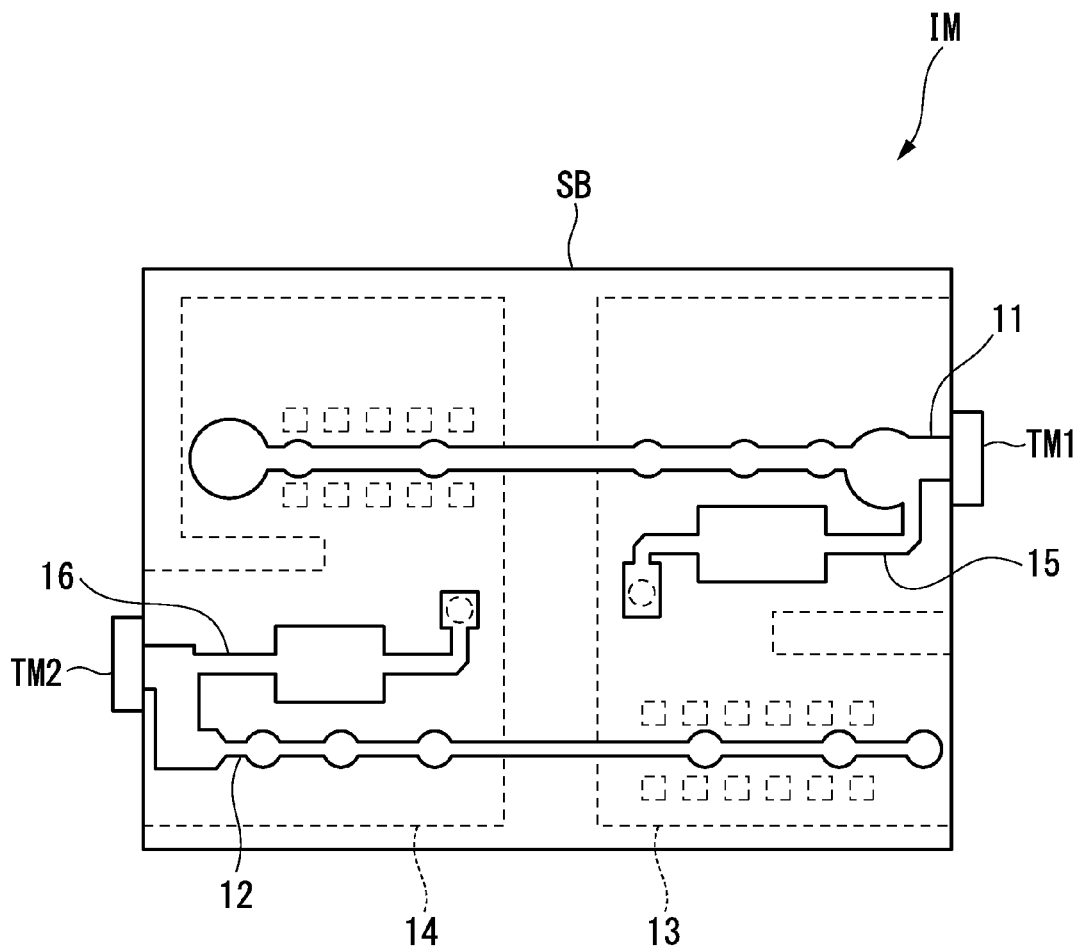
FIG. 5 is a plan view that shows an example of the modularization of an insulation module in accordance with a first preferred embodiment of the present invention.

The above-described insulation circuit 1 can be formed on a board together with an electrical circuit or an electronic circuit and, as shown in FIG. 5, can be implemented as a standalone insulation module having an insulation function. FIG. 5 is a plan view that shows an example of the modularization of an insulation module in accordance with a first preferred embodiment of the present invention. The insulation circuit module IM shown in FIG. 5 has a board SB, on the front surface of which are formed the patterns 11 and 12 and on the rear surface of which are formed the patterns 13 and 14, an input terminal TM1 connected to the pattern 11, and an output terminal TM2 connected to the pattern 12. The input terminal TM1 is mounted to the right edge part of the board SB, and the output terminal TM2 is mounted to the left edge part of the board SB.

The above-noted insulation module IM can be used as an RF component. For example, in an RF circuit, it can be inserted between components that are required to be DC-insulated. Because it is not restricted by the frequency band, frequency characteristics, group delay characteristics, size, shape, type of board, and the board layer constitution and the like, the insulation circuit 1, in addition to integrating the function thereof, can be implemented as a laminated chip, using LTCC (low-temperature co-fired ceramic) or other ceramic or the like. In FIG. 5, a cover (not shown) that covers the board SB may be made the insulation module IM.

(Communication Equipment)

Figure 6:
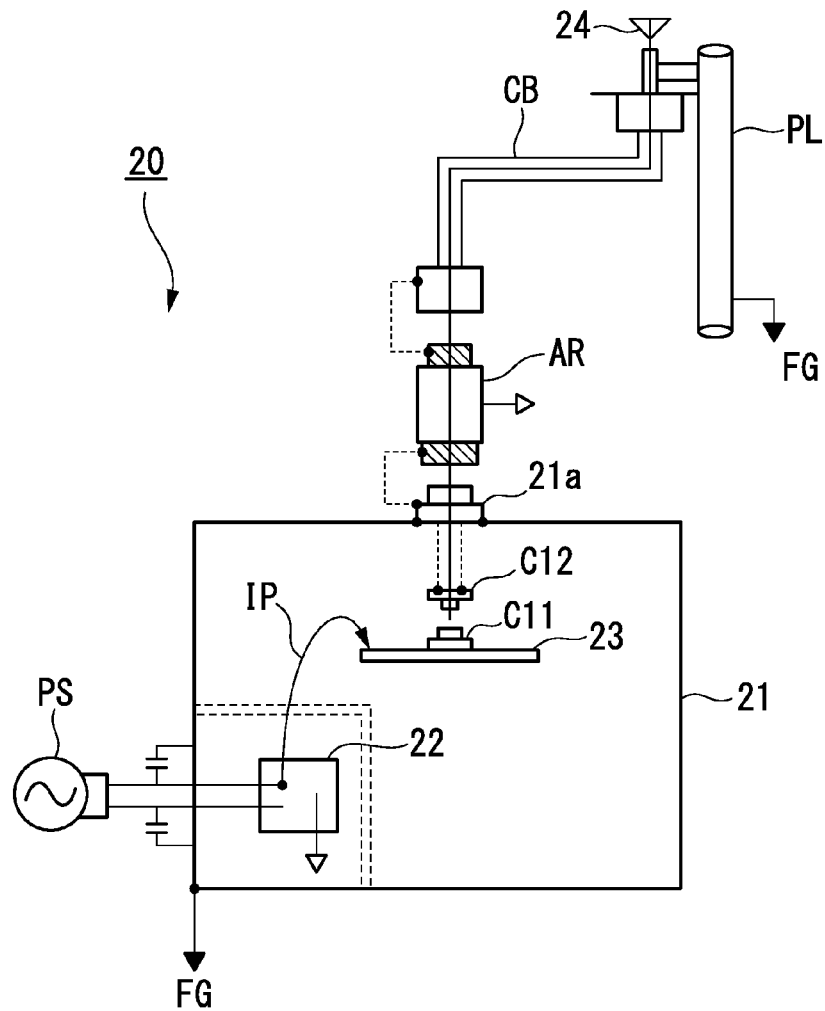
FIG. 6 is a view illustrating the main parts of the constitution of a communication equipment in accordance with a first preferred embodiment of the present invention.

FIG. 6 is a view illustrating the main parts of the constitution of a communication equipment in accordance with a first preferred embodiment of the present invention. As shown in FIG. 6, a communication equipment 20 in accordance with a first preferred embodiment of the present invention has an enclosure 21, a power supply unit 22, a communication board 23, and a remote antenna 24, and communicates with another device (not shown) by transmitting an RF signal from the remote antenna 24 to the other device and by receiving an RF signal transmitted from the other device by the remote antenna 24.

The communication equipment 20 shown in FIG. 6 is, for example, a field device (wireless field device) capable of wireless communication that conforms to ISA 100.11a, which is a wireless communication standard for industrial automation established by the ISA (International Society of Automation). The communication equipment 20 may be a device that is capable of only transmission of an RF signal, or a device capable of only reception of an RF signal.

The enclosure 21 is an internally hollow box member formed from a metal having a high rigidity, such as high-rigidity aluminum, which by grounding serves as the frame ground FG. The enclosure 21 houses within it the power supply unit 22 and the communication board 23, and is of sealed construction, so as to satisfy a pressure resistance and explosion-proofness standard. The enclosure 21 is provided with a pressure-resistant explosion-proof connector 21a, to which an antenna such as the remote antenna 24 is connected. The power supply unit 22 generates power (for example, DC power) IP that is required within the communication equipment 20, using power that is supplied from an external power supply PS.

The communication board 23 is a printed circuit board that outputs the RF signal to be transmitted to the remote antenna 24 and inputs the RF signal received by the remote antenna 24. The communication board 23 is provided with a connector C11 to which a connector C12 that is connected to a pressure-resistant explosion-proof connector 21a of the enclosure 21 is mounted. The communication board 23 is supplied with the power supply IP generated by the power supply unit 22.

Figure 7:
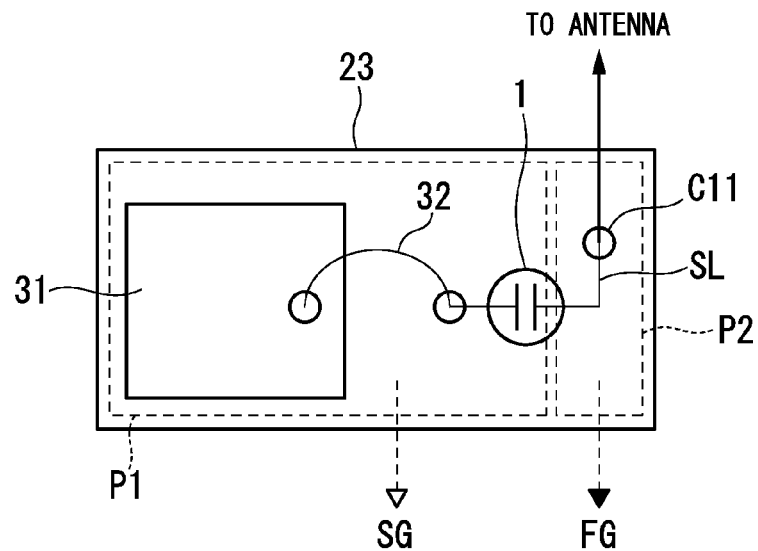
FIG. 7 is a plan view illustrating in schematic form the communication board provided in the communication equipment in accordance with a first preferred embodiment of the present invention.

FIG. 7 is a plan view illustrating in schematic form the communication board provided in the communication equipment in accordance with a first preferred embodiment of the present invention. As shown in FIG. 7, the communication board 23, in addition to the above-noted insulation circuit 1 and the connector C11, is provided with a signal processing circuit 31. A ground pattern P1 connected to the signal ground SG and a ground pattern P2 connected to the frame ground FG are formed on the rear surface of the communication board 23, the ground patterns P1 and P2 forming the patterns 13 and 14 (refer to FIG. 1) provided in the insulation circuit 1.

The signal processing circuit 31 is a circuit that performs processing of an RF signal that is input and output. Specifically, it generates an RF signal that is output to the remote antenna 24 and performs detection, demodulation, and the like of an RF signal received by the remote antenna 24. The insulation circuit 1 is connected to the signal processing circuit 31 by a coaxial cable 32, and DC-insulates the signal ground SG and the frame ground FG. The reflection and pass characteristics of the insulation circuit 1 are designed to match the frequency used in communication by the communication equipment 20.

The remote antenna 24 is mounted to a pole PL and is connected to the pressure-resistant explosion-proof connector 21a of the enclosure 21 via a coaxial cable CB. In the example shown in FIG. 6, an arrester (lightning arrester) AR is mounted between the coaxial cable CB and the pressure-resistant explosion-proof connector 21a of the enclosure 21.

Although the arrester AR is not absolutely necessary, because it enables prevention of damage to the communication board 23 and the like by abnormal overvoltage conditions such as with lightning surges, it is desirable that the arrester AR be mounted as shown in FIG. 6.

In this manner, the communication equipment 20 of a first preferred embodiment of the present invention DC-insulates the signal ground SG and the frame ground FG by the insulation circuit 1 provided on the communication board 23. For this reason, even in a condition in which it is easy for noise to be superimposed onto the RF signal transferred via the coaxial cable CB to which the remote antenna 24 is connected, it is possible to improve the noise immunity performance.

Although in the foregoing a wireless field device capable of wireless communication is given as an example of the communication equipment 20, the communication equipment of the present invention is not restricted to being a device capable of wireless communication, and may be a device capable of cable communication. That is, the present invention can be applied to a device that performs at least one of transmission and reception of an RF signal by a cable.

INDUSTRIAL APPLICABILITY

The present invention can be widely applied to insulation circuits and communication equipments, and can improve the noise immunity performance while satisfying an intrinsic safety and explosion-proofness standard, without using discrete elements such as chip capacitors.

DESCRIPTION OF THE REFERENCE SYMBOLS 1 insulation circuit
11 pattern (first pattern)
11a to 11g impedance matching pad
12 pattern (second pattern)
12a to 12f impedance matching pad
13 pattern (third pattern)
13a impedance matching slit (first slit)
13b aperture pattern (first aperture part)
14 pattern (fourth pattern)
14a impedance matching slit (second slit)
14b aperture pattern (second aperture part)
15 auxiliary pattern (fifth pattern)
16 auxiliary pattern (sixth pattern)
20 communication equipment
21 enclosure
21a pressure-resistant explosion-proof connector
22 power supply unit
23 communication board
24 remote antenna
31 signal processing circuit
32 coaxial cable
AR arrester (lightning arrester)
$C_1$, $C_2$ capacitive component between patterns 11 and 13
$C_3$, $C_4$ capacitive component between patterns 11 and 14
$C_5$, $C_6$ capacitive component between patterns 12 and 13
$C_7$, $C_8$ capacitive component between patterns 12 and 14
C11, C12 connector
D1 longitudinal direction
D2 intersecting direction
FG frame ground
IM insulation module
IP power supply
L1 distance set forth in an intrinsic safety and explosion-proofness standard
$L_1$, $L_2$ inductive component of pattern 11
$L_3$, $L_4$ inductive component of pattern 13
$L_5$, $L_6$ inductive component of pattern 12
$L_7$, $L_8$ inductive component of pattern 14
$L_{in}$ inductive component (pattern 15)
$L_{out}$ inductive component (pattern 16)
P1, P2 ground pattern
PL pole
PS external power supply
$R_1$, $R_2$ resistive component of pattern 11
$R_3$, $R_4$ resistive component of pattern 13
$R_5$, $R_6$ resistive component of pattern 12
$R_7$, $R_8$ resistive component of pattern 14
R11, R21 curves showing the actually measured values of the reflection characteristics of the insulation circuit 1
R12, R22 curves showing the results of simulations of the reflection characteristics of the insulation circuit 1
SB board
SG signal ground
SL signal line
T1 one end of pattern 11
T2 the other end of pattern 11
T3 the other end of pattern 12
T4 one end of pattern 12
T6 one end of pattern 13
T7 one end of pattern 14
T11 curve showing the actually measured values of the pass characteristics of the insulation circuit 1
T12 curve showing the results of a simulation of the pass characteristics of the insulation circuit 1
TM1 input terminal
TM2 output terminal
V1 first via
V2 second via

The invention claimed is:

1. An insulation circuit comprising:
a first pattern formed on a first layer of a board and receiving an RF signal;
a second pattern formed on the first layer next to the first pattern, the second pattern outputting the RF signal received by the first pattern;
a third pattern formed on a second layer different from the first layer of the board so as to overlap the first and second patterns respectively when seen in a plan view manner, the third pattern connecting to a signal ground; and
a fourth pattern formed on the second layer next to the third pattern so as to overlap the first and second patterns respectively when seen in a plan view manner, the fourth pattern connecting to a frame ground.

2. The insulation circuit according to claim 1, wherein
the third pattern has at least one first aperture part formed along at least one side of the overlapping part with the second pattern when seen in plan view manner; and
the fourth pattern has at least one second aperture part formed along at least one side of the overlapping part with the first pattern when seen in plan view manner.

3. The insulation circuit according to claim 2, wherein
the first aperture part is formed along both sides of the overlapping part of the second and third patterns; and
the second aperture part is formed along both sides of the overlapping part of the first and fourth patterns.

4. The insulation circuit according to claim 2, wherein
the first aperture part is formed along one side of the overlapping part of the second and third patterns.

5. The insulation circuit according to claim 2, wherein
the second aperture part is formed along one side of the overlapping part of the first and fourth patterns.

6. The insulation circuit according to claim 1, wherein
a first slit extending in the direction in which the first and second patterns extend is formed in the third pattern, when seen in plan view manner, between the overlapping part with the first pattern and the overlapping part with the second pattern; and
a second slit extending in the direction in which the first and second patterns extend is formed in the fourth pattern, when seen in plan view manner, between the overlapping part with the first pattern and the overlapping part with the second pattern.

7. The insulation circuit according to claim 1 further comprising:
a fifth pattern formed on the first layer so as to overlap with the third pattern when seen in plan view manner, one end of the fifth pattern being connected to the first pattern, the other end of the fifth pattern being connected to the third pattern through a first via; and
a sixth pattern formed on the first layer so as to overlap with the fourth pattern when seen in plan view manner, one end of the sixth pattern being connected to the second pattern, the other end of the sixth pattern being connected to the fourth pattern through a second via.

8. The insulation circuit according to claim 1, wherein the third and fourth patterns are separated by at least a distance within the second layer that corresponds to intrinsic safety and explosion-proofness.

9. The insulation circuit according to claim 1, wherein the board is a double-sided board on which patterns are formed on the first layer that is a front surface and on the second layer that is a rear surface.

10. The insulation circuit according to claim 1, wherein the board is a multilayer board providing at least one layer in which patterns are formed between the front surface and the rear surface.

11. The insulation circuit according to claim 1, wherein a board having a prescribed thickness is interposed between the first and second patterns and the third and fourth patterns.

12. The insulation circuit according to claim 1, wherein the first and second patterns are straight-line shapes and have a plurality of pads for impedance matching.

13. The insulation circuit according to claim 1, wherein one end of the first and second patterns have pre-established characteristic impedances and the other ends thereof are open ends.

14. The communication equipment performing at least one of transmission and reception of an RF signal; the communication equipment comprising:
an insulation circuit comprising:
a first pattern formed on a first layer of a board and receiving the RF signal;
a second pattern formed on the first layer next to the first pattern and outputting the RF signal received by the first pattern;
a third pattern formed on a second layer different from the first layer of the board so as to overlap the first and second patterns respectively when seen in a plan view manner and connecting to a signal ground; and
a fourth pattern formed on the second layer next to the third pattern so as to overlap the first and second patterns respectively when seen in a plan view manner and connecting to a frame ground, wherein
a signal line in which the RF signal is transmitted is connected to the first and second patterns and the signal ground and the frame ground are DC-insulated.

15. The communication equipment according to the claim 14, wherein
a first slit that is extending in the direction in which the first and second patterns are extending is formed in the third pattern, when seen in plan view manner, between the overlapping part with the first pattern and the overlapping part with the second pattern; and
a second slit that is extending in the direction in which the first and second patterns are extending is formed in the fourth pattern, when seen in plan view manner, between the overlapping part with the first pattern and the overlapping part with the second pattern.

16. The communication equipment according to claim 14, wherein
the third pattern has at least one first aperture part formed along at least one side of the overlapping part with the second pattern when seen in plan view manner; and
the fourth pattern has at least one second aperture part formed along at least one side of the overlapping part with the first pattern when seen in plan view manner.

17. The communication equipment according to claim 14, wherein the insulation circuit further comprising:
a fifth pattern formed on the first layer so as to overlap with the third pattern when seen in plan view manner, one end of the fifth pattern being connected to the first pattern, the other end of the fifth pattern being connected to the third pattern through a first via; and
a sixth pattern formed on the first layer so as to overlap with the fourth pattern when seen in plan view manner, one end of the sixth pattern being connected to the second pattern, the other end of the sixth pattern being connected to the fourth pattern through a second via.

18. The communication equipment according to claim 14, wherein the third and fourth patterns are separated by at least a distance within the second layer that corresponds to intrinsic safety and explosion-proofness.

* * * * *